United States Patent
Kajiyama et al.

(10) Patent No.: US 6,625,862 B2
(45) Date of Patent: *Sep. 30, 2003

(54) METHOD OF MANUFACTURING A PROCESSING APPARATUS

(75) Inventors: Morio Kajiyama, Tokyo-To (JP); Sakae Nakatsuka, Shikishima-Machi (JP); Yasushi Aiba, Kofu (JP)

(73) Assignees: Hitachi Ltd., Tokyo-To (JP); Tokyo Electron Limited, Tokyo-To (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/550,015

(22) Filed: Apr. 14, 2000

(65) Prior Publication Data

US 2003/0010446 A1 Jan. 16, 2003

(30) Foreign Application Priority Data

Apr. 16, 1999 (JP) .......................................... 11-110147

(51) Int. Cl.[7] .............................................. C23C 16/00
(52) U.S. Cl. ........................... 29/458; 118/715; 451/41; 451/38; 427/532; 216/102; 29/459
(58) Field of Search .................... 118/715, 724, 118/725, 728; 29/458, 459, 557, 558, 559; 451/41, 38, 57, 54; 427/532, 592, 543, 546, 593, 591, 587; 216/52, 89, 91, 102

(56) References Cited

U.S. PATENT DOCUMENTS

| | | | | |
|---|---|---|---|---|
| 3,655,467 A | * | 4/1972 | Sopp, Jr. ..................... 216/102 |
| 4,820,371 A | * | 4/1989 | Rose .......................... 156/345 |
| 4,854,263 A | * | 8/1989 | Chang et al. ................ 118/715 |
| 4,872,947 A | * | 10/1989 | Wang et al. ................. 156/643 |
| 5,000,113 A | * | 3/1991 | Wang et al. ................. 118/723 |
| 5,581,874 A | * | 12/1996 | Aoki et al. .................... 29/825 |
| 5,595,602 A | * | 1/1997 | Harlan ........................ 118/715 |
| 5,648,175 A | * | 7/1997 | Russell et al. ............ 428/472.3 |
| 5,895,530 A | * | 4/1999 | Shrotriya et al. ........... 118/715 |
| 5,934,980 A | * | 8/1999 | Koos et al. .................... 451/41 |
| 6,036,782 A | * | 3/2000 | Tanaka et al. .............. 118/715 |
| 6,055,927 A | * | 5/2000 | Shang et al. ......... 118/723 ME |
| 6,063,198 A | * | 5/2000 | Bang et al. ................. 118/715 |
| 6,063,203 A | * | 5/2000 | Satoh ......................... 118/728 |
| 6,106,630 A | * | 8/2000 | Frankel ....................... 118/728 |
| 6,117,244 A | * | 9/2000 | Bang et al. ................. 118/715 |
| 6,156,151 A | * | 12/2000 | Komino et al. ............. 156/345 |
| 6,162,112 A | * | 12/2000 | Miyazaki et al. ............. 451/41 |
| 6,194,628 B1 | * | 2/2001 | Pang et al. ................. 558/900 |
| 6,319,324 B1 | * | 11/2001 | Nguyen et al. ............. 118/697 |

FOREIGN PATENT DOCUMENTS

JP  55021130 A1 * 2/1980
JP  10-340896   12/1998

* cited by examiner

Primary Examiner—Gregory Vidovich
Assistant Examiner—Jermie E. Cozart
(74) Attorney, Agent, or Firm—Smith, Gambrell & Russell, LLP

(57) ABSTRACT

A wafer processing apparatus (14) has a wafer processing vessel (16). A wafer is mounted on a susceptor (22) included in the wafer processing apparatus. Process gases are supplied to the wafer through a shower head (74) disposed in an upper region within the processing vessel to carry out a predetermined process for processing the wafer. The surfaces of aluminum members (16, 74) employed in the wafer processing apparatus are subjected to an organic mechanical chemical polishing process, a blasting process and an aluminum oxide film forming process in that order. It is difficult for unnecessary films to adhere to the thus treated surfaces and it is difficult for unnecessary films deposited on the thus treated surfaces to come off the surfaces. Consequently, intervals between cleaning operations can be extended and production of particles can be suppressed.

6 Claims, 8 Drawing Sheets

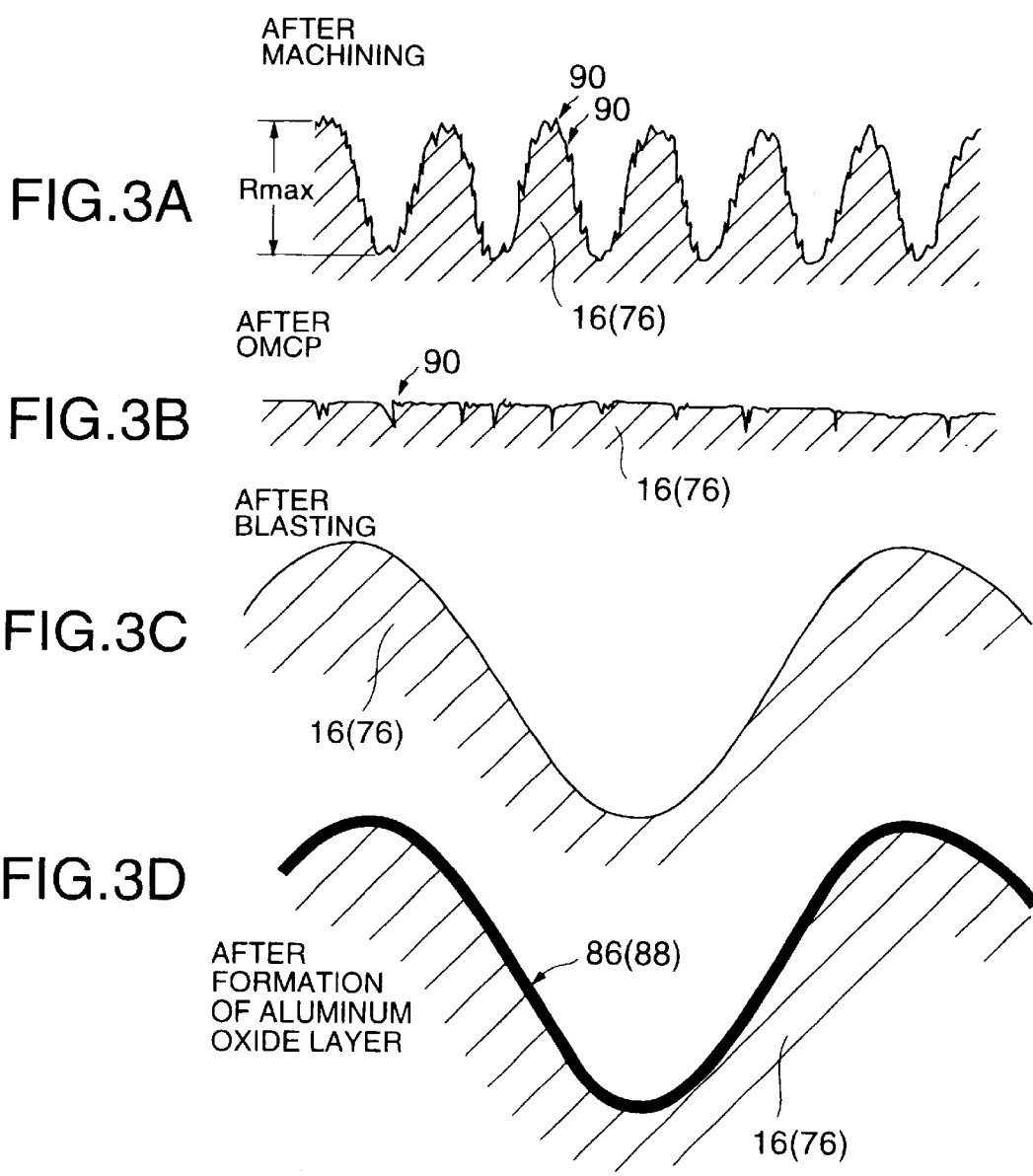

SHOWER HEAD (PRIOR ART)
AFTER PROCESSING 1000 WAFERS

SHOWER HEAD (THIS INVENTION)
AFTER PROCESSING 3000 WAFERS

EXAMPLE

COMPARATIVE EXAMPLE 1

COMPARATIVE EXAMPLE 2

COMPARATIVE EXAMPLE 3

METHOD OF MANUFACTURING A PROCESSING APPARATUS

BACKGROUND OF THE INVENTION

1. Field of the Invention

The present invention relates to a processing apparatus for subjecting a workpiece, such as a semiconductor wafer, to a film forming process, and a method of manufacturing the same.

2. Description of the Related Art

Generally, when fabricating a semiconductor integrated circuit, a thin film of a metal or a metal compound, such as W (tungsten), WSi (tungsten silicide), Ti (titanium) TiN (titanium nitride) or TiSi (titanium silicide), is deposited on a semiconductor wafer, i.e., workpiece, to form a wiring pattern on a surface of the semiconductor wafer or to fill up recesses between wiring lines.

The metal thin film of this kind is formed by one of three methods, namely, a $SiH_2Cl_2$ (dichlorosilane) reduction method, a $SiH_4$ (silane) reduction method and a $H_2$ (hydrogen) reduction method. The $SiH_2Cl_2$ reduction method uses, for example, $SiH_2Cl_2$, as a reducing gas and deposits a W film or a WSi film in an environment of a high temperature on the order of 600° C. to form a wiring pattern. The $SiH_4$ reduction method uses, for example, $SiH_4$ gas as a reducing gas and deposits a W film or a WSi film in an environment of a high temperature in the range of 350 to 500° C. lower than that used by the $SiH_2Cl_2$ reduction method to form a wiring pattern. The $H_2$ reduction method uses, for example, $H_2$ gas as a reducing gas and deposits a W film in an environment of a temperature in the range of 350 to 450° C. to fill up recesses formed on the surface of a wafer, such as recesses between wiring lines.

All of those methods uses $WF_6$ (tungsten hexafluoride). Referring to FIG. 8 showing a general film forming apparatus for forming such a metal thin film, a thin susceptor 4 formed of a carbonaceous material or an aluminum compound is disposed in a processing vessel 2 formed of aluminum or the like in a cylindrical shape. A transparent quartz plate 6 is disposed under the susceptor 4, and heating devices 8, such as halogen lamps, are disposed under the quartz plate 6. A semiconductor wafer W is supported on the susceptor 4. A vertically movable annular clamping ring 10 is pressed against the peripheral part of the wafer to hold the wafer W on the susceptor 4. A shower head 12 of aluminum is disposed opposite to the susceptor 4. A plurality of gas supply holes 13 are formed in the bottom wall of the shower head 12 in a substantially uniform distribution. Generally, the inner surfaces of the processing vessel 2 and the shower head 12, which are made of aluminum, exposed to the reaction chamber is finished by an anodic aluminum oxide film forming process (process for forming Alumite®).

Heat rays emitted by the heating devices 8 travel through the transparent quartz plate 6, heats the susceptor 4 to heat the semiconductor wafer W supported on the susceptor 4 indirectly and to maintain the semiconductor wafer W at a predetermined temperature. Meanwhile, process gases including $WF_6$ gas and $H_2$ gas are supplied uniformly over the surface of the wafer W through the gas supply holes 13 of the shower head 12 disposed above the susceptor 4 to form a metal film, such as a W film, on the surface of the wafer W.

When processing a semiconductor wafer by various processes in the processing vessel, generation of minute particles that causes yield reduction must be suppressed to a minimum. For example, in a film forming process, unnecessary films are deposited inevitably on the inner surfaces of the processing vessel 2 and the shower head 12 when depositing a film on a desired surface of the wafer. The thickness of such unnecessary films increases with the number of processed wafers and, when the thickness exceeds a certain level, the unnecessary films come off the surfaces to produce particles.

Generally, the unnecessary films must be removed by wet cleaning, or dry cleaning using $ClF_3$ gas or the like after a predetermined number of wafers in the range of 1000 to 3000 wafers have been processed. It is desirable from the view point of processing wafers at a high throughput to carry out such a cleaning operation at the longest possible intervals. In the present state of art, however, the interval between the cleaning operations, although dependent on the type of the film, corresponds to a period in which 1000 to 3000 wafers are processed at the longest.

When forming a W film, F contained in $WF_6$ gas, i.e., process gas, attacks a base film, such as a TiN film, formed on a wafer and causes TiF compound or the like to scatter, the TiF compounds reacts with moisture and W to deposit a blue W/Ti/F/O composite compound on the respective inner surfaces of the shower head 12 and the processing vessel 2. Such a W/Ti/F/O composite compound acts as nuclei and promotes the deposition of unnecessary W films, which shortens the intervals of the cleaning operations.

The present invention has been made to solve the foregoing problems effectively and it is therefore an object of the present invention to provide a processing apparatus including metallic components including a processing vessel and having surfaces finished by a special process to make difficult the deposition of unnecessary films on the surfaces and the separation of deposited films from the surfaces in order that the cleaning intervals can be extended, and capable of suppressing production of particles, and to provide a method of manufacturing such a processing apparatus.

Various cleaning methods have been proposed to improve throughput. The inventors of the present invention turned their attention to surfaces on which unnecessary films are deposited, found conditions that makes the deposition of film difficult and have made the present invention.

SUMMARY OF THE INVENTION

According to a first aspect of the present invention, a processing apparatus comprises: a processing vessel capable of being evacuated; a susceptor disposed inside the processing vessel to support a workpiece thereon; a shower head disposed in an upper region within the processing chamber to supply process gases toward the workpiece supported on the susceptor for processing the workpiece for a predetermined process; and aluminum members exposed to an interior of the processing vessel, wherein the aluminum members have surfaces processed by an organic mechanical chemical polishing process, a blasting process and an anodic aluminum oxide film forming process in that order.

According to a second aspect of the present invention, a method of manufacturing a processing apparatus comprising a processing vessel capable of being evacuated; a susceptor disposed inside the processing vessel to support a workpiece thereon; a shower head disposed in an upper region within the processing chamber to supply a process gas toward the workpiece supported on the susceptor for processing the workpiece for a predetermined process; and metal members of aluminum exposed to the interior of the processing vessel, comprises a step of subjecting a surface of at least one of the metal members to an organic mechanical chemical polishing process, a blasting process and an aluminum oxide film forming process in that order, and a step of applying the metal members thus processed by those processes in the processing vessel.

When the surfaces of the metal members of aluminum of the processing apparatus are thus processed beforehand, it is difficult for unnecessary films to adhere to the surfaces of the metal members exposed to a processing chamber defined by the processing vessel and films deposited on the same surfaces hardly come off the surfaces. Consequently, the intervals between the cleaning operations can be extended to improve throughput and to suppress production of particles.

BRIEF DESCRIPTION OF THE DRAWINGS

FIGS. 3A, 3B, 3C and 3D are typical views of assistance in explaining a surface treatment process for processing a surface of an aluminum member;

DESCRIPTION OF THE PREFERRED EMBODIMENTS

A processing apparatus in a preferred embodiment of the present invention will be described with reference to the accompanying drawings.

Figure 1:
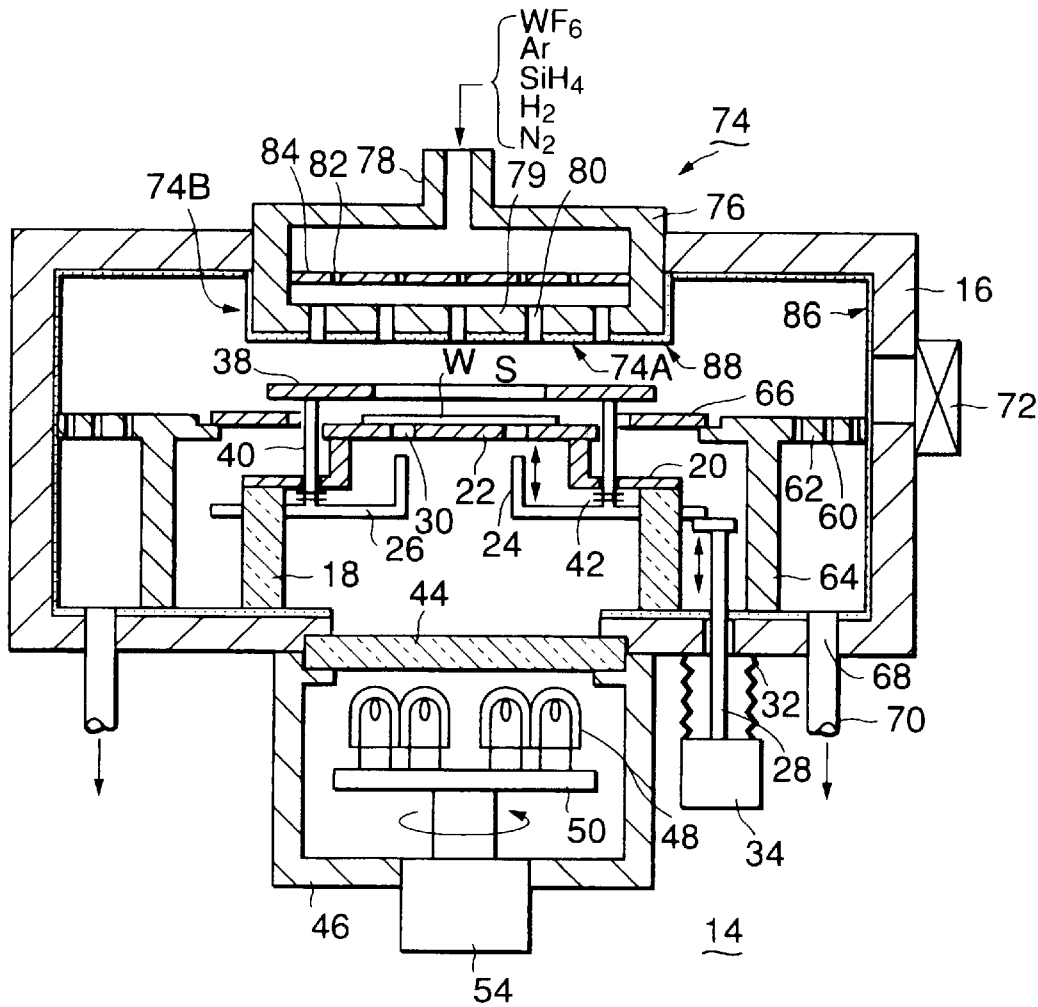
FIG. 1 is a schematic sectional view of a processing apparatus in a preferred embodiment of the present invention.
Figure 2:
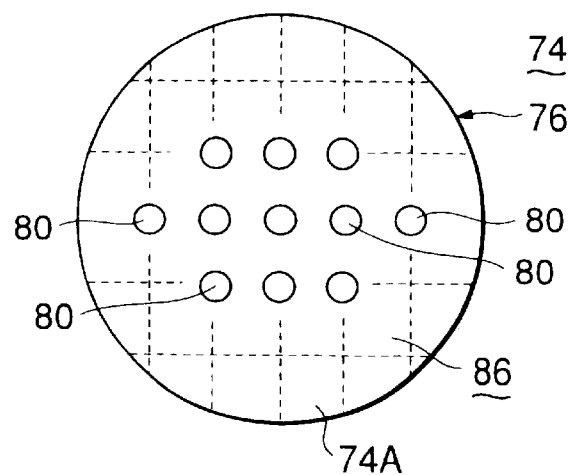
FIG. 2 is a bottom view of a shower head included in the processing apparatus shown in FIG. 1.
Figure 4A:
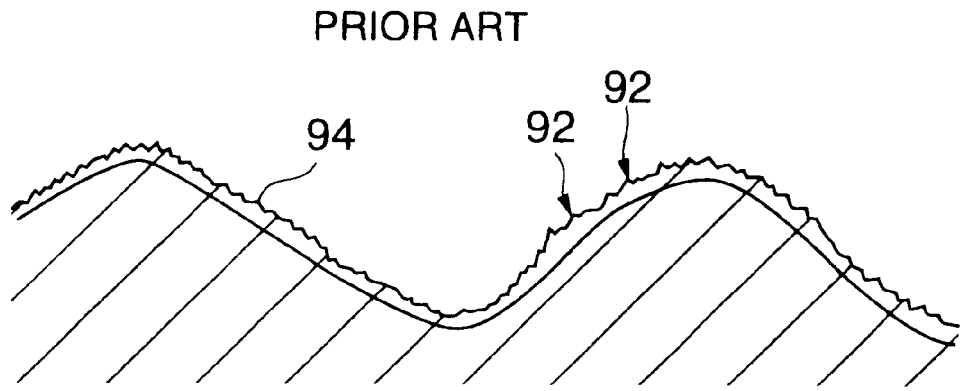
FIGS. 4A and 4B are typical views of surfaces of aluminum members.
Figure 4B:
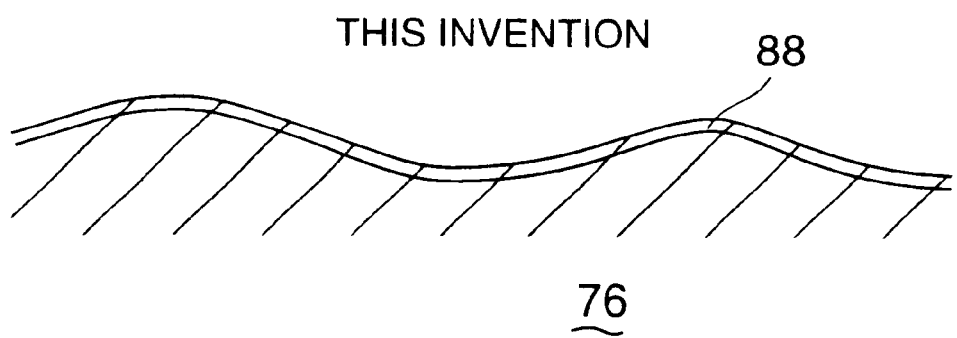

FIG. 1 shows a processing apparatus in a preferred embodiment of the present invention, FIG. 2 shows the bottom of a shower head included in the processing apparatus shown in FIG. 1, FIGS. 3A, 3B, 3C and 3D explain a surface treatment process for processing a surface of an aluminum member and FIGS. 4A and 4B show typical views of surfaces of aluminum members.

In the following description, the processing apparatus in this embodiment is supposed to be a film forming apparatus. The film forming apparatus 14 has a processing vessel 16 of, for example, aluminum formed in a cylindrical shape or a box-shape. A cylindrical reflector 18 is set upright in the processing vessel 16 on the bottom wall of the processing vessel 16. A holding member 20 having, for example, an L-shaped cross section is put on the reflector 18, and a susceptor 22 for supporting a semiconductor wafer W, i.e., workpiece, thereon is supported on the holding member 20.

The reflector 18 and the holding member 20 are formed of a heat ray transmissive material, such as quartz. The susceptor 22 is a member having a thickness on the order of 1 mm formed of, for example, a carbonaceous material or an aluminum compound, such as AlN.

A plurality of lifting pins 24, for example, three lifting pins 24 are set upright on a support member 26 under the susceptor 22. The support member 26 is moved vertically by a lifting rod 28 vertically extending through the bottom wall of the processing vessel 16 to lift up the wafer W by raising the lifting pins 24 through lifting pin holes 30 formed in the susceptor 22.

The lower end part of the lifting rod 28 is extended through a bellows 32 having opposite ends connected to the bottom wall of the processing vessel 16 and an actuator 34 to seal the processing vessel 16 and is connected to the actuator 34. A clamping ring 38 having an annular shape corresponding to the outline of the wafer W is disposed above the peripheral part of the susceptor 22 to press the peripheral part of the wafer W against the susceptor 22 to hold the wafer on the susceptor 22. The clamping ring 38 is connected to the support member 26 by support rods 40 vertically slidably extended through holes formed in the holding member 20 so that the clamping ring 38 is moved vertically together with the lifting pins 24. Coil springs 42 are wound round the support rods 40 so as to extend between the holding member 20 and the support member 26 to assist the downward movement of the clamping ring 38 for reliable clamping of the wafer W. The lifting pins 24, the support member 26 and the holding member 20 are formed of a heat ray transmissive material, such as quartz.

An opening is formed in a portion of the bottom wall of the processing vessel directly below the susceptor 22 and is covered hermetically with a transparent plate 44 formed of a heat ray transmissive material, such as quarts. A box-shaped heater case 46 is attached to the bottom wall of the processing vessel 16 so as to surround the transparent plate 44. A heating unit including a plurality of heating lamps 48 is disposed in the heater case 46. The heating lamps 48 are supported on a rotary table 50 serving also as a reflecting mirror. The rotary table 50 is driven for rotation by a motor 54 attached to the bottom wall of the heater case 46. Heat rays emitted by the heating lamps 48 travels through the transparent plate 44 and fall on the lower surface of the susceptor 22 to heat the susceptor 22. A heating device by resistance heater may be employed instead of the heating lamps 48.

An annular straightening plate 62 provided with a plurality of straightening holes 60 is supported on a vertical, annular column 64 so as to surround the susceptor 22. A quartz ring 66 is supported on the inner peripheral part of the straightening plate 62. The outer peripheral part of the clamping ring 38 comes into contact with the inner peripheral part of the quartz ring 66 to restrain gases from flowing into a space under the clamping ring 38. Discharge ports 68 are formed in the bottom wall of the processing vessel 16 at positions below the straightening plate 62. The discharge ports 68 are connected to vacuum pump by a discharge line 70 to maintain a predetermined vacuum in the processing vessel 16. A gate valve 72 is attached to the side wall of the processing chamber 16. A wafer is carried into and carried out of the processing vessel 16 through the gate valve 72.

A shower head 74 for supplying a process gas into the processing vessel 16 is dispose opposite to the susceptor 22 on the top wall of the processing vessel 16. The shower head 74 has a cylindrical body 76 formed of, for example, aluminum. The cylindrical body 76 has a top wall provided with a gas inlet 78. The gas inlet 78 is connected via gas supply lines to gas sources for supplying process gases, for example such as $WF_6$, Ar, $SiH_4$, $H_2$ and $N_2$. The respective flow rates of the source gases are controllable.

The cylindrical body 76 has a bottom wall 79 provided with a plurality of gas injecting holes 80 through which gases supplied into the cylindrical body 76 are discharged into a processing space S. The gas injecting holes 80 are distributed in the entire bottom wall to discharge the gases over the entire surface of the wafer W. A diffusing plate 84 formed with a plurality of diffusing holes is disposed in the cylindrical body 76 to distribute the process gases uniformly over the surface of the wafer W.

The present invention is characterized in coating surfaces of the processing vessel 16 and the shower head 74, i.e., surfaces of aluminum members, with coating layers 86 and 88, respectively, by subjecting the surfaces of the processing vessel 16 and the shower head 74 to an organic mechanical chemical polishing process (OMCP process), a blasting process and an anodic aluminum oxide film forming process in that order before assembling the processing apparatus. Both the surfaces of the processing vessel 16 and the shower head 74 are processed in this embodiment. However, the effect of the present invention can be obtained when at least the surface of either the processing vessel 16 or the shower head 74 is processed according to the present invention.

The surfaces are those exposed to the processing space S defined by the processing vessel 16; more concretely, the inner surface of the processing vessel 16 and the surface of the shower head 74, exposed to the processing space S. The coating layer 86 is formed over the entire inner surface of the processing vessel 16. A gas injecting surface 74A, i.e., a lower surface of the bottom wall of the shower head 74, and an outer surface 74B of the side wall of the shower head 74 are coated with the coating layer 88. It is desirable that all the surfaces of the aluminum members exposed to the processing space S are subjected to the foregoing series of surface treatment processes. The inner surface of the cylindrical body 76 may be finished by the foregoing series of surface treatment processes. The OMCP process polishes a surface of a workpiece by mechanical buffing work or the like using a mixture prepared by mixing an organic solvent, such as an alcohol, and abrasive grains of, for example, $Al_2O_3$. The surface roughness of the treated surface is adjusted by selectively determining the grain size of the abrasive grains. The OMCP process is capable of mirror-finishing the surface of a metal member of a relatively soft metal, such as aluminum. The outgassing and moisture adsorption of surfaces treated by the OMCP process are less than those of surfaces finished by an ordinary polishing process.

The blasting process blows alumina grains or the like through a nozzle against the surface of a workpiece from a position at a fixed distance from the surface by a high-pressure gas, such as air or Ar gas, of, for example, 3 kg/cm² to form particular, minute irregularities in the surface. The distance between the surface of the workpiece and the nozzle is about 200 mm. Blasting process conditions including the pressure of the gas, the distance between the nozzle and the surface, and the type and grain size of the abrasive grains can be selectively determined. The blasting process is followed by an etching process using a solvent, such as caustic soda to remove abrasive grains and impurities remaining on the surface of the workpiece. The aluminum oxide film forming process subjects the surface of the aluminum member to anodic oxidation in an electrolytic solution to form an alumina layer (layer of Alumite®) of a thickness on the order of, for example, 7000 Å.

Changes in the morphology of the surface of the cylindrical body 76 of the shower head 74 and the inner surface of the processing vessel 16 during the foregoing series of surface treatment processes will be typically described with reference to FIGS. 3A to 3D. FIG. 3A is an enlarged sectional view of the surface of a workpiece of a predetermined shape having a surface machined and finished in a predetermined surface roughness. Although the surface is finished in the predetermined surface roughness Ra, the surface has many minute cutting marks 90 similar to minute rugged serrations as shown in FIG. 3A. When the surface is treated by the OMCP process, the surface roughness is reduced greatly so that the maximum surface roughness Rmax becomes very small while the wavy shape almost disappears as shown in FIG. 3B. However, the minute cutting marks 90 remain to some degree. In spite of this, the smoothness of the surface is improved. It is to be noted that if the wavy shape should remain considerably, the cutting marks 90 will be left as they are even after the blasting process is performed after the OMCP process.

When the surface is then treated by the blasting process, the cutting marks 90 disappear and the surface becomes very smooth as shown in FIG. 3C. Then, the surface is subjected to the anodic aluminum oxide film forming process to form the coating layer 86 (88) as shown in FIG. 4D to complete the surface treatment.

The processing vessel 16 and the shower head 74, i.e., the metal members, are subjected to the foregoing three surface treatment processes while the same are individual members, and the same are assembled to form the shower head and the inner surfaces of the processing vessel after being treated by the foregoing three treatment processes.

The function of the processing apparatus thus constructed will be described.

When depositing a metal film, such as a W film on the surface of the wafer W, the gate valve 72 attached to the side wall of the processing vessel 16 is opened, the wafer W is conveyed into the processing vessel 16 by a conveyor arm, and then the lifting pins 24 are raised to transfer the wafer W from the conveyor arm to the lifting pins 24. The lifting pin 24 supporting the wafer W is lowered by moving the lifting rod 28 downward to mount the wafer W on the susceptor 22. The lifting rod 28 is lowered further to press the peripheral part of the wafer W against the susceptor 22 by the clamping ring 38, so that the wafer W is held fixedly on the susceptor 22.

Subsequently, process gasses, such as $WF_6$, $SiH_4$, $H_2$ and such, are supplied at predetermined flow rates from process gas sources, not shown, respectively, to the shower head 74. A mixture of the process gases is supplied uniformly into the processing vessel 16 through the gas injecting holes 80 formed in the bottom wall of the cylindrical body 76. At the same time, the internal atmosphere of the processing vessel 16 is evacuated through the discharge ports 68 to maintain the interior of the processing vessel 16 at a predetermined vacuum in the range of, for example, 200 to 13,330 Pa. The heating lamps 48 are turned on and the rotary table 50 supporting the heating lamps 48 is rotated to irradiate the back surface of the susceptor 22 with heat rays traveled through the transparent plate 44 for heating. Since the thickness of the susceptor 22 is as small as about 1 mm, the susceptor 22 is heated rapidly and the wafer W supported on the susceptor 22 can be rapidly heated to a predetermined temperature. The mixed gas takes part in predetermined chemical reactions and, for example, a W film is deposited on the surface of the wafer W.

After many wafers W have been successively processed by the film forming process, unnecessary films are formed on surfaces exposed to the processing space S, such as the gas injecting surface 74A and the side surface 74B of the cylindrical body 76 of the shower head 74, and the inner surface of the processing vessel 16. However, according to the present invention, the surfaces 74A and 74B of the cylindrical body 76 and the inner surface of the processing vessel 16 have been treated by the series of surface treatment processes to form smooth surfaces. Therefore, unnecessary films are hardly able to deposit thereon. Even when unnecessary films are deposited on those surface-treated surfaces, the unnecessary films have difficulty in coming off the surface-treated surfaces. Accordingly, the cleaning operation can be carried out at long intervals and production of particles can be suppressed.

The deposition of the unnecessary films will be described with reference to FIGS. 4A and 4B. FIG. 4A is an enlarged, fragmentary sectional view of, for example, a conventional shower head. As shown in FIG. 4A, a surface having cutting marks 92 is treated to form an aluminum oxide film 94. FIG. 4B is an enlarged, fragmentary sectional view of the cylindrical body 76 of the shower head 74 in accordance with the present invention. It will be seen from FIG. 4B that a very smooth surface is formed with the aluminum oxide film 88 thereon.

Since the conventional shower head shown in FIG. 4A has cutting marks on the order of several microns, an unnecessary film is liable to adhere thereto easily. Since the adhesion of the unnecessary film and the surface of the conventional shower head is low, the unnecessary film tends to come off the surface of the shower head. Besides, fragments forming the cutting marks 92 tend to come off and portions of the coating layer 94 corresponding to the cutting marks 92 are inferior in corrosion resistance. Consequently, the surface is corroded. Since the aluminum oxide film formed on the surface having the cutting marks 92 tends to become weak in peel resistance, the aluminum surface is liable to be exposed and an unnecessary film is liable to be deposited on the exposed aluminum surface. The surface of the shower head of the present invention shown in FIG. 4B is very smooth. An unnecessary film has difficulty in being deposited on such a very smooth surface. Since the adhesion of the unnecessary film and the smooth surface of the shower head is high, the unnecessary film is hardly able to come off the surface of the shower head. Since the surface has cutting marks scarcely, the aluminum oxide film 88 is able to maintain high corrosion resistance.

Figure 5A:
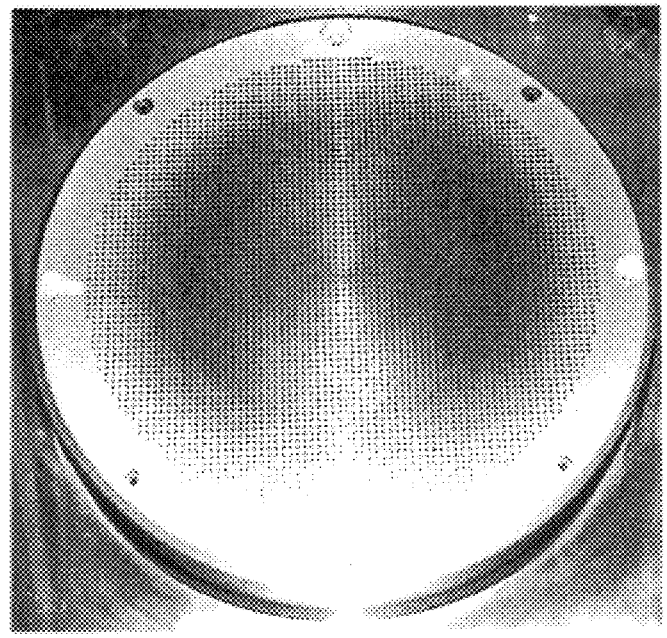
FIGS. 5A and 5B are photographs of a conventional shower head and a shower head employed in the present invention, respectively, showing unnecessary films deposited on the shower heads.
Figure 5B:
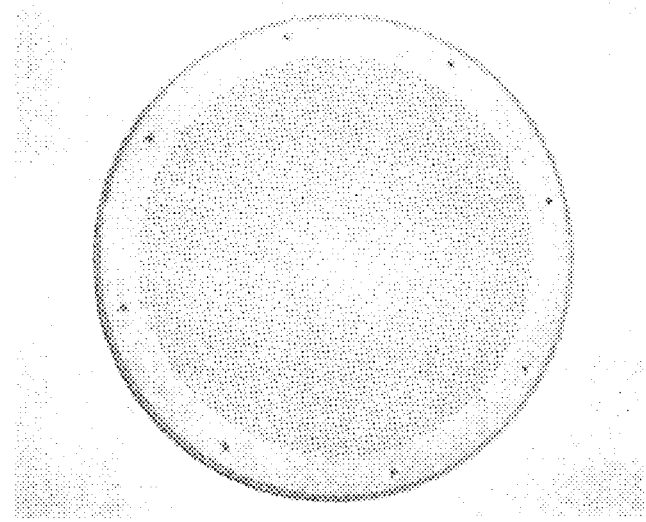

A conventional shower head finished by the aluminum oxide film forming process and the shower head of the present invention were subjected to comparative tests. The results of the comparative tests are shown in FIGS. 5A to 6B. FIG. 5A shows the condition of the conventional shower head after being used for the film forming process for processing 1000 wafers. As obvious from FIG. 5A, considerable unnecessary films are deposited in the central part and the middle part of the shower head, FIG. 5B shows the condition of the shower head according to the present invention after being used for the film forming process for processing 3000 wafers. As obvious from FIG. 5B, in spite of the shower head being used for processing wafers three times as many as those processed by using the conventional shower head, there is no significant deposition of unnecessary films on the shower head.

Figure 6A:
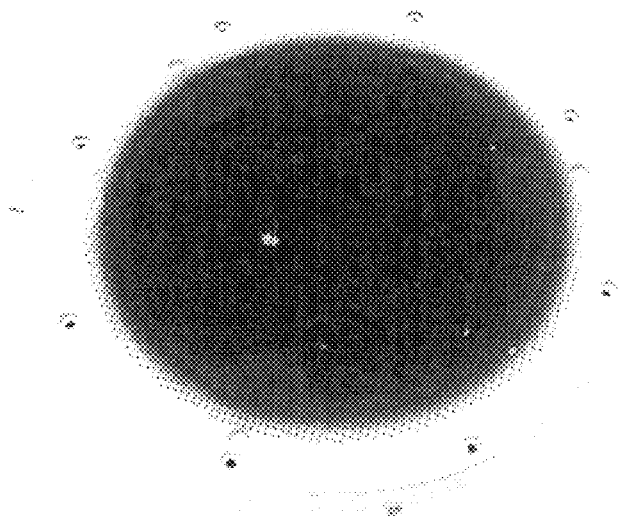
FIGS. 6A and 6B are photographs of a conventional shower head and a shower head employed in the present invention, respectively, showing unnecessary films deposited on the shower heads.
Figure 6B:
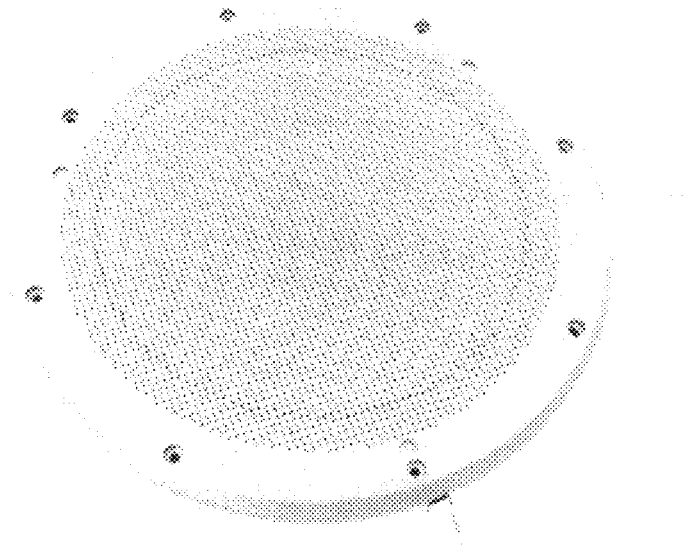
Figure 7A:
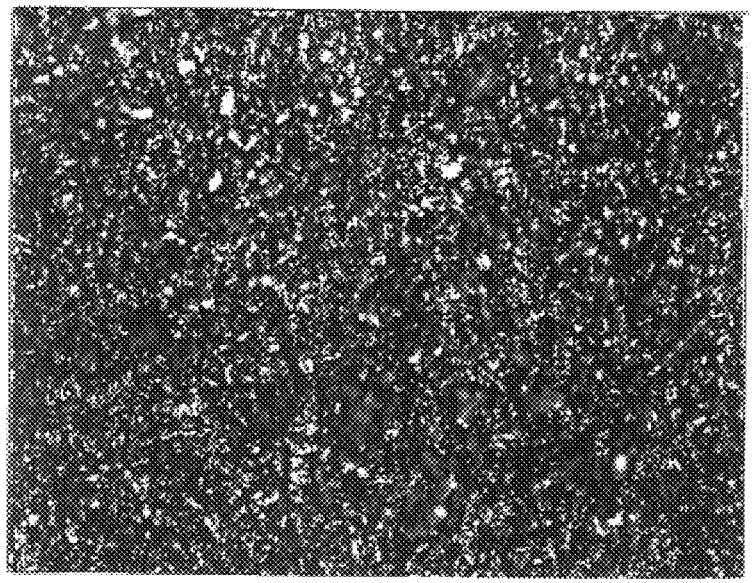
FIGS. 7A, 7B, 7C and 7D are photographs of surfaces of a component of the processing apparatus of the present invention and components of a conventional processing apparatus.
Figure 7B:
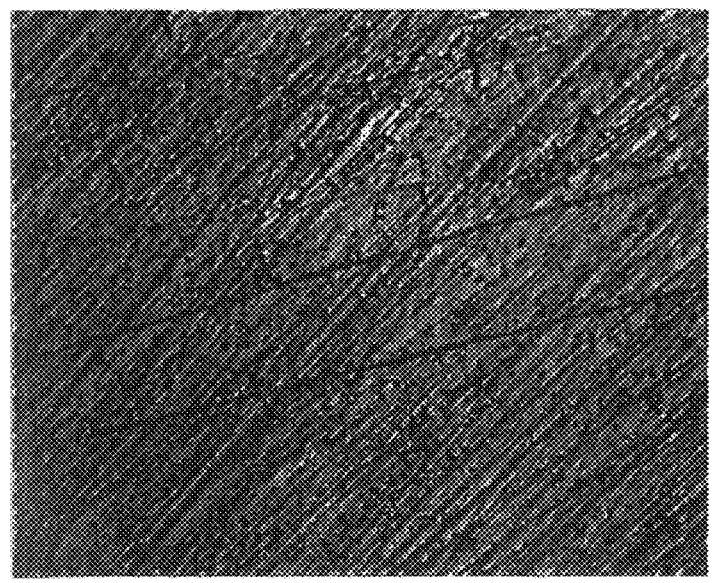
Figure 7C:
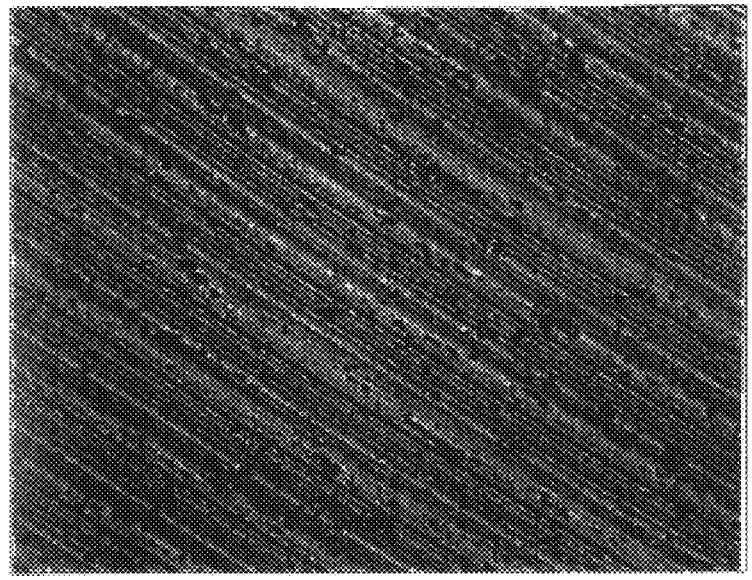
Figure 7D:
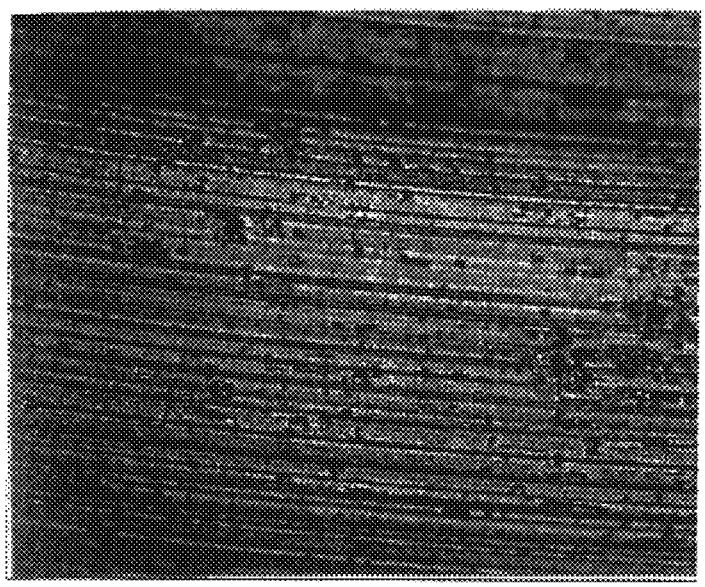
Figure 8:
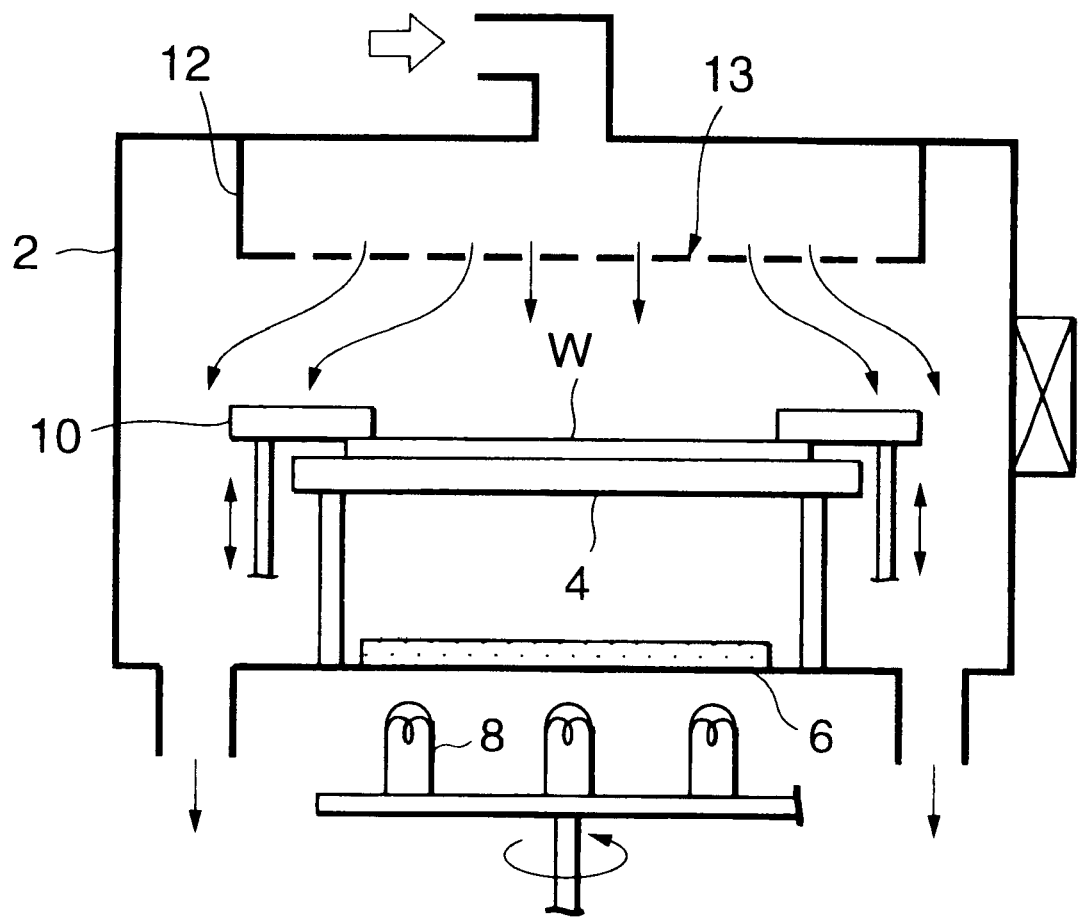
FIG. 8 is a schematic view of a conventional processing apparatus.

FIG. 6A shows the condition of another conventional shower head after being used for the film forming process for processing 1000 wafers. As shown in FIG. 6A, the entire gas injecting surface of the shower head is coated with an unnecessary film. FIG. 6B shows the condition of the shower head of the present invention after being used for the film forming process for processing 5000 wafers. As obvious from FIG. 6B, in spite of the shower head being used for processing wafers five times as many as those processed by using the conventional shower head shown in FIG. 6A, only a very small amount of unnecessary films is deposited on the shower head.

Shower heads in an example and comparative examples were tested to verify the effect of surface roughness Ra and of the blasting process on the corrosion resistance of the shower heads.

| | Ex.C(OMCP + blast + Al oxide) | Comp. Ex. 1 (OMCP + Al oxide) | Comp. Ex. 2 (Al oxide) | Comp. Ex. 3 (Al oxide) |
|---|---|---|---|---|
| Ra ($\mu$m) | 2.30 | 0.21 | 0.34 | 4.25 |
| $R_{max}$ ($\mu$m) | 15.36 | 1.84 | 2.88 | 18.00 |
| Smoothness | Smooth | | . . . Cutting marks . . . | |
| Anti-corrosion | Good | Not good | Not good | Poor |

In the evaluation of corrosion resistance, "Good" signifies slight corrosion, "Not good" signifies considerable corrosion, and "poor" signifies bad corrosion. In corrosion, resistance tests, an acid solution of pH3 prepared by mixing cupric chloride in a sodium chloride solution was sprayed over the surfaces of samples. FIGS. 7A to 7D are microphotographs (200×magnification) of the surfaces of the samples.

The shower head in Example was prepared by machining a workpiece, subjecting the workpiece to the OMCP process, the blasting process and the anodic aluminum oxide forming process. The shower head in Comparative Example 1 in FIG. 7B was prepared by machining a workpiece and subjecting the workpiece to the OMCP process and the anodic aluminum oxide film forming process. No blasting process was carried out. The shower heads in Comparative Examples 2 and 3 shown in FIGS. 7C and 7D, respectively, were prepared by machining workpieces and subjecting the workpiece to the aluminum oxide film forming process and were not subjected to the OMCP process and the blasting process. Shower heads in Comparative Examples 2 and 3 differ from each other in surface roughness Ra.

It is known from the test results and the microphotographs shown in FIGS. 7A to 7D that many cutting marks remain on the surfaces of the shower heads in Comparative Examples 1 to 3 which were not subjected to the blasting process, and the corrosion resistance of the shower heads in Comparative Examples 1 to 3 are "Not good" or "Poor". Therefore, the shower heads in Comparative Examples 1 to 3 are not satisfactory. Cutting marks remain scarcely on the smooth surface of the shower head embodying the present invention, and the corrosion resistance of the same shower head is satisfactory. The test results proved that corrosion resistance is scarcely dependent on surface roughness.

It was known from close observation of the corroded portions of the surfaces that portions arranged along the cutting marks are corroded. Therefore, it is inferred that portions of the aluminum oxide films corresponding to the cutting marks are weak and that the blasting process reduces the minute serrated rugged irregularities to improve the corrosion resistance of the aluminum oxide films.

Although the invention has described as applied to the processing apparatus provided with the shower head having the surface finished by the series of surface treatment processes and the processing vessel having the inner surface finished by the series of surface treatment processes, naturally, the effect of the present invention can be exercised when at least the surface of either the processing vessel or the shower head is finished by the series of surface treatment processes.

Other aluminum members provided in the processing vessel, as well as the shower head and the processing vessel, may be finished by the series of surface treatment processes.

Although the invention has been described as applied to a W film forming process, the present invention is applicable to processes for forming other films, such as insulating films including a $SiO_2$ film, a SiN film. Naturally, the application of the present invention is not limited to the film forming apparatus, but the present invention is applicable also to oxidizing and diffusing apparatus, annealing apparatus, sputtering apparatus, etching apparatus, ashing apparatus and the like.

The workpiece is not limited to a semiconductor wafer; the present invention is applicable to processes, such as processes for forming a film on LCD substrates, glass substrates and the like.

As is apparent from the foregoing description, the processing apparatus according to the present invention exercises the following excellent working effects.

Since the aluminum members of the processing apparatus are finished by the series of surface treatment processes, the sharpness of the cutting marks formed on the surfaces of the aluminum members is moderated, the surfaces of the aluminum members are very smooth, the deposition of unnecessary films on the surfaces of the aluminum members can be suppressed, the adhesion of the unnecessary films to the surfaces of the aluminum members is enhanced and, therefore, the peeling of the unnecessary films from the surfaces of the aluminum members can be suppressed.

Accordingly, intervals between cleaning operations can be extended, the throughput of the processing apparatus can be increased, production of particles can be suppressed and the yield of wafers can be improved.

What is claimed is:

1. A method of manufacturing a processing apparatus having a plurality of constitutive members which include a processing vessel capable of being evacuated; a susceptor disposed inside the processing vessel to support to a workpiece thereon; and a shower head disposed in an upper region of the processing vessel to supply process gases toward the workpiece supported on the susceptor for processing the workpiece for a predetermined process, wherein the constitutive members include an aluminum member exposed to an interior of the processing vessel, said method comprising the steps of:

subjecting a surface of the aluminum member to an organic mechanical chemical polishing;
   then subjecting the surface to a blasting process;
   thereafter subjecting the surface to an anodic aluminum oxide film forming process; and
   arranging the aluminum member, having been subjected to the organic mechanical chemical polishing process, the blasting process and the anodic aluminum oxide film forming process, so that the surface of the aluminum member is exposed to the interior of the processing vessel.

2. The method according to claim 1, wherein the organic mechanical chemical polishing process is a mechanical polishing process using a fluid prepared by mixing an organic solvent and abrasive grains.

3. The method according to claim 1, wherein the anodic aluminum oxide film forming process is a process for anodic oxidation of aluminum using an electrolytic solution.

4. The method according to claim 1, wherein the blasting process is followed by an etching process for etching the surface of the aluminum member with a solvent.

5. The method according to claim 1, wherein the aluminum member is the shower head.

6. The method according to claim 1, wherein the aluminum member is the processing vessel, and the surface is an inner surface of the processing vessel.

* * * * *